United States Patent
Prineas et al.

(10) Patent No.: US 8,680,641 B2
(45) Date of Patent: Mar. 25, 2014

(54) SYSTEM AND METHOD OF PLANAR PROCESSING OF SEMICONDUCTORS INTO DETECTOR ARRAYS

(75) Inventors: John P. Prineas, Iowa City, IA (US); Jonathan T. Olesberg, Iowa City, IA (US); Chris Coretsopoulos, Iowa City, IA (US)

(73) Assignee: University of Iowa Research Foundation, Iowa City, IA (US)

( * ) Notice: Subject to any disclaimer, the term of this patent is extended or adjusted under 35 U.S.C. 154(b) by 187 days.

(21) Appl. No.: 13/031,093

(22) Filed: Feb. 18, 2011

(65) Prior Publication Data
US 2011/0260278 A1    Oct. 27, 2011

Related U.S. Application Data

(60) Provisional application No. 61/306,372, filed on Feb. 19, 2010.

(51) Int. Cl.
*H01L 31/0304* (2006.01)
*H01L 31/18* (2006.01)

(52) U.S. Cl.
USPC ............. 257/443; 257/E33.076; 257/E31.022

(58) Field of Classification Search
USPC ............... 257/233, 443, E33.076, E31.022, 257/E31.019
See application file for complete search history.

(56) References Cited

U.S. PATENT DOCUMENTS

| 7,755,079 B2 | 7/2010 | Kim et al. | |
|---|---|---|---|
| 2006/0057820 A1* | 3/2006 | Yamanaka | 438/458 |
| 2009/0045395 A1 | 2/2009 | Kim et al. | |

OTHER PUBLICATIONS

Arnold et al., "Diffusion in III—V Semiconductors from Spin-on Film Sources," J. Phys. D. Appl. Phys., 1984, pp. 443-474, 17, Great Britain.
Bett et al., "Study of Zn Diffusion into GaSb from the Vapour and Liquid Phase," Journal of Crystal Growth, 1997, pp. 9-16, 181, Elsevier Science B.V., Germany.
Conibeer et al., "Zinc Diffusion in Tellurium Doped Gallium Antimonide," Journal of Electronic Materials, 1996, pp. 1108-1112, vol. 25, No. 7.
Dakshinamurthy et al., "Fabrication and Characterization of GaSb Based Thermophotovoltaic Cells Using Zn Diffusion from a Doped Spin-On Glass Source," Journal of Electronic Materials, 1999, pp. 355-359, vol. 28, No. 4.
Heinz, "Diffusion from Zinc-Doped Spin-On Sources into N-Gallium Antimonide," Solid-State Electronics, 1993, pp. 1685-1688, vol. 36, No. 12, Pergamon Press Ltd., Great Britain.
Heinz, "Spin-on Source for Zinc Diffusion in (100) Gallium Antimonide," J. Electrochem. Soc.: Solid-State Science and Technology, Jan. 1988, pp. 250-252, vol. 135, No. 1.
Jager et al., "Defect Formation During Zn Diffusion in GaP and GaSb," Philosophical Magazine A, 2000, pp. 1-7, vol. 80, No. 1, Taylor & Francis Ltd., United Kingdom.

(Continued)

*Primary Examiner* — Whitney T Moore
(74) *Attorney, Agent, or Firm* — Pepper Hamilton LLP

(57) ABSTRACT

An article of manufacture and a method of defining a photodetector element are provided. The article of manufacture includes a photodector element comprising a junction formed by a first III-V semiconductor layer having a first charge type and a second III-V semiconductor layer comprising a second dopant having a second charge type. The second III-V semiconductor layer is disposed between the first III-V semiconductor layer and a wafer. Patterned dopant regions having a third charge type, the third charge type being the same as the first charge type, are disposed in the first III-V semiconductor layer.

12 Claims, 3 Drawing Sheets

(56) References Cited

OTHER PUBLICATIONS

Kamanin et al., "Zinc Diffusion into Gallium Antimonide from Polymer Spin-On Films," Defect and Diffusion Forum, 2001, vols. 194-199, pp. 751-754, Scitec Publications, Switzerland.

Mauk and Andreev, "GaSb-Related Materials for TPV Cells," Semiconductor Science Technology, 2003, pp. S191-S201, 18, Institute of Physics Publishing Ltd., United Kingdom.

Yoon et al., "The Characteristics of Zn-Doped InP Using Spin-on Dopant as a Diffusion Source," Journal of Electronic Materials, 2002, pp. 244-247, vol. 31, No. 4.

* cited by examiner

SYSTEM AND METHOD OF PLANAR PROCESSING OF SEMICONDUCTORS INTO DETECTOR ARRAYS

II. RELATED APPLICATIONS

The present application claims the benefit of and priority to U.S. Provisional Application No. 61/306,372, entitled "System and Method of Planar Processing of Semiconductors Into Detector Arrays," filed on Feb. 19, 2010, which is hereby incorporated herein by reference.

I. GOVERNMENT RIGHTS

This invention was made with Government support under Contract Nos. DK-60657 and DK-02925 awarded by the National Institutes of Health, and Contract No. W15P7T-10-C-S605, awarded by the U.S. Army. The Government has certain rights in the invention.

II. TECHNICAL FIELD

The present invention relates generally to semiconductors. More specifically, but not exclusively, the present invention relates to photodiode detectors and methods of manufacturing same.

III. BACKGROUND

Photodiode detectors typically include one- or two-dimensional arrays of electrically-patterned detector elements in a semiconductor material. The photodiode detector is in electrical communication with a device, e.g., a camera, and is used to detect electromagnetic radiation (e.g., infrared light, visible light, ultraviolet light, etc.). Photodiode detectors made from antimonide III-V semiconductor materials are emerging as a competitive alternative material system to InGaAs and HgCdTe semiconductor materials for detection of infrared electromagnetic radiation. Examples of antimonide III-V semiconductor materials are GaInAsSb quaternary alloys and InAs/Ga(In)Sb short period superlattices. GaInAsSb quaternary materials have cut-off wavelengths ranging between about 1.7 to 4.9 microns. InAs/Ga(In)Sb short period superlattices have cut-off wavelengths between 2 to 30 microns. Cameras operating at these wavelengths are important in such applications as point chemical sensing (medical and environmental), thermal imaging (military and security), astronomy, and food monitoring.

The electrically-isolated detector elements are presently formed with a "mesa" manufacturing technique. In this technique, a doped semiconductor material (e.g., p-GaSb) is epitaxially grown over an oppositely-doped semiconductor material (e.g., n-GaSb) to form a p-n (or a n-p) junction. The detector elements are patterned by conventional photolithography and then etched to form "mesa" structures.

A known problem with the "mesa" manufacturing technique is that the etch process damages (e.g., by undercutting) the mesa sidewalls, resulting in significant current leakage (e.g., by generation-recombination current leakage). Current leakage limits detector performance as the size of the detector element shrinks. To minimize sidewall leakage and stabilize detector performance, additional processing steps are required to chemically clean, passivate, and encapsulate the mesa sidewalls. Accordingly, it is desirable to improve detector performance by reducing current leakage through mesa sidewalls. It is further desirable to reduce manufacturing time and costs by reducing the number of manufacturing steps required to form detector elements.

IV. SUMMARY

Embodiments of the present invention address and overcome one or more of the above shortcomings and drawbacks, by providing articles of manufacture and methods for defining a photodetector element. Embodiments of the present invention are particularly well-suited for, but by no means limited to, infrared imaging, night vision, and/or the military.

In one aspect, the invention includes a method of defining a photodetector element. The method includes depositing an insulator on a surface of a photodetector element, the insulator comprising a first dopant having a first charge type. The method further includes removing portions of the insulator to form patterned deposits of the insulator. The method further includes thermally diffusing at least a portion of the first dopant from the patterned deposits of the insulator into a first layer of the photodetector element. The first layer of the photodetector element comprises a second dopant having a second charge type.

In some embodiments, the method includes thermally diffusing the at least a portion of the first dopant, from the patterned deposits of the insulator, across a junction formed between the first layer and a second layer. The junction can be formed by depositing the second layer on a base layer, the second layer comprising a second III-V semiconductor material comprising a third dopant having a third charge type. The junction can further be formed by depositing the first layer on the second layer, the first layer comprising a first III-V semiconductor material comprising the second dopant having the second charge type. The second layer can comprise a third dopant having a third charge type, the third charge type being different than the second charge type.

The method can include thermally diffusing the at least a portion of the first dopant from the patterned deposits of the insulator across a n-p junction, the n-p junction formed between the first layer and the second layer. In some embodiments, the method can include thermally diffusing the at least a portion of the first dopant from the patterned deposits of the insulator across a p-n junction, the p-n junction formed between the first layer and the second layer. A reverse junction can be formed between the second layer and a diffused portion of the first dopant.

The depositing step can comprise applying a spin-on dielectric to the surface of the photodetector element. In some embodiments, a cap layer can be deposited on the surface of the photodetector element and the patterned deposits of the insulator. The thermally diffusing step can comprise annealing the patterned deposits of the insulator layer and the photodetector element. In some embodiments, the first III-V semiconductor material comprises a first III-V quaternary material and/or the second III-V semiconductor material comprises a second III-V quaternary material.

In another aspect, the invention includes an article of manufacture. The article of manufacture includes a photodetector element comprising a junction formed by a first III-V semiconductor layer comprising a first dopant having a first charge type. The photodetector element further comprises a second III-V semiconductor layer comprising a second dopant having a second charge type. The second III-V semiconductor layer is disposed between the first III-V semiconductor layer and a wafer. The article of manufacture further comprises patterned dopant regions having a third charge type, the third charge type being the same as the first charge type. The patterned dopant regions are disposed in at least the first III-V semiconductor layer. In some embodiments, the patterned dopant regions are disposed in the second III-V semiconductor layer. The patterned dopant regions can form a reverse junction with the first III-V semiconductor layer. In some embodiments, the patterned dopant regions define an array of photodetector elements. In some embodiments, the junction is a n-p junction.

The first III-V semiconductor layer can comprise a first III-V quaternary material and/or the second III-V semiconductor layer can comprise a second III-V quaternary material. In some embodiments, the first III-V semiconductor layer and/or the second III-V semiconductor material comprises a GaInAsSb quaternary material. The first III-V semiconductor layer can be lattice matched to the second III-V semiconductor layer.

In some embodiments, the article of manufacture includes a base layer comprising a third III-V semiconductor material. The third III-V semiconductor material can comprise a fourth dopant having a fourth charge type. The base layer can be disposed between a wafer and the first III-V semiconductor layer. The article of manufacture can include a contact layer comprising a fourth III-V semiconductor material. The fourth III-V semiconductor material can comprise a fifth dopant having a fifth charge type. The second III-V semiconductor layer can be disposed between a wafer and the contact layer.

Additional features and advantages of the invention will be made apparent from the following detailed description of illustrative embodiments that proceeds with reference to the accompanying drawings.

V. BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following figures:

FIGS. 1a-g depict an exemplary manufacturing process for a photodiode detector according to an embodiment of the invention.

VI. DETAILED DESCRIPTION

The present invention is directed to embodiments of a method of defining photodetector elements. The method includes depositing an insulator on a surface of a photodetector, forming patterned deposits of the insulator, and thermally diffusing at least a portion of a dopant from the insulator into a first layer of the photodetector element. The thermal diffusion of the dopant into the photodetector results in a definition of one or more photodetector elements. This method can reduce the current leakage from the photodetector element that otherwise occurs from sidewalls created by the known "mesa" manufacturing method. Reduced current leakage can improve the performance and accuracy of the photodetector element. Additionally, the method can reduce the number of manufacturing steps (e.g., compared to the "mesa" manufacturing method"), which can result in lower manufacturing costs.

The present invention is also directed to embodiments of an article of manufacture that includes a photodetector that has a reduced current leakage. The article of manufacture includes a photodetector element comprising a junction formed between a first doped III-V semiconductor layer and a second doped III-V semiconductor layer. Patterned dopant regions are disposed in at least the first doped III-V semiconductor layer and can form a reverse junction with the first doped III-V semiconductor layer. The patterned dopant regions can define a photodector element that has a reduced current leakage. Reduced current leakage can improve the performance and accuracy of the photodetector element.

Figure 1A:
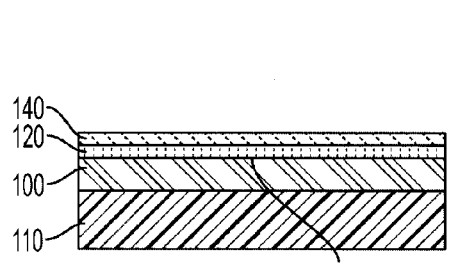

FIGS. 1a-g depict an exemplary process for manufacturing a photodiode detector according to an embodiment of the invention. FIG. 1a depicts a wafer 10 in which a p-doped (i.e., a dopant having a p charge type) semiconductor layer 100 is deposited (e.g., epitaxially grown) on a base layer 110. In some embodiments, semiconductor layer 100 is a III-V semiconductor material. For example, p-doped semiconductor layer 100 can include a quaternary alloy such as $Ga_{1-x}In_x As_y Sb_{1-y}$, an InAs/Ga(In)Sb superlattice, or similar p-doped semiconductor material. The p-doped semiconductor layer 100 can be about 3-7 μm or about 5 μm thick and have a dopant concentration between about 1e16-1e19 cm$^{-3}$ or about 1e17-1e18 cm$^{-3}$. In some embodiments, the p-doped semiconductor layer 100 comprises Zn, Be, Hg, Cd, and/or other similar p-type dopant materials. Base layer 110 includes a n-doped substrate material, a n-doped buffer layer (i.e., a first buffer layer), and a p-doped buffer layer (i.e., a second buffer layer). In some embodiments, the substrate material includes a III-V semiconductor (e.g., GaSb, GaAs, etc.). For example, photodiode detectors can be manufactured on antimony-based III-V semiconductor substrates. Antimony-based III-V semiconductor substrates can have a 6.1 Angstrom lattice constant. In some embodiments, the substrate material is deposited on a wafer. The n-doped substrate material is disposed between the n-doped buffer layer and a wafer. The n-doped substrate material can be between about 300-1,000 μm, about 500-700 μm, or about 600 μm thick. The dopant concentration of the n-doped substrate material can be less than or equal to about 2e17 cm$^{-3}$ and can include Te and/or other similar n-dopant materials as the dopant.

The n-doped (i.e., a dopant having a n charge type) buffer layer is disposed between the n-doped substrate material and the n-doped buffer layer. The n-doped buffer layer (i.e., the first buffer layer) can include a n-GaSb or a similar n-doped semiconductor. In some embodiments, the n-doped buffer layer is between about 500-1,000, about 600-800, or about 700 nm thick. The dopant concentration in the n-doped buffer layer can be between about 1e17-1e19 cm$^{-3}$ and the dopant can include Te and/or other similar dopant materials. The p-doped buffer layer (i.e., the second buffer layer) can include p-GaSb or a similar p-doped semiconductor layer. In some embodiments, the p-doped buffer layer is between about 1-3 μm thick. The dopant concentration of the p-doped buffer layer can be at least 1e18 cm$^{-3}$, e.g., between about 1e18-1e19 cm$^{-3}$, and the dopant can include Zn, Be, Hg, Cd, and/or other similar dopant materials.

In some embodiments, base layer 110 includes a p-doped substrate material (e.g., p-GaSb) and the first buffer layer can be a p-doped buffer layer (e.g., p-GaSb). The p-doped substrate material can have a dopant concentration of at least 1e18 cm$^{-3}$, e.g., between about 1e18-1e19 cm$^{-3}$ and between about 300-1,000 μm, about 500-700 μm, or about 600 μm thick. The p-doped substrate can include Zn, Be, Hg, Cd, and/or other similar p-dopant materials. The p-doped buffer layer (i.e., the first buffer layer) can be between about 500-1,000 nm thick or about 700-800 nm thick. The dopant concentration of the p-doped buffer layer (i.e., the first buffer layer) can be at least 1e18 cm$^{-3}$, e.g., between about 1e18-1e19 cm$^{-3}$ and can be about 1-3 μm or about 2 μm thick. The p-doped buffer layer can include Zn, Be, Hg, Cd, and/or other similar p-dopant materials.

In some embodiments, an optional third layer (e.g., about 5-20 nm or about 10 nm in thickness) can be deposited between the n-doped buffer layer (i.e., the first buffer layer), and the p-doped buffer layer (i.e., the second buffer layer). The third layer can comprise AlAsSb or other similar materials (e.g., wide bandgap materials). The third layer can prevent electrical leakage between the first buffer layer and the second buffer layer.

A n-doped semiconductor layer 120 is deposited (e.g., epitaxially grown) on top of the p-doped semiconductor layer 100. The n-doped semiconductor layer 120 can include a III-V semiconductor material, such as n-GaSb, a n-doped quaternary alloy such as $Ga_{1-x}In_xAs_ySb_{1-y}$, a n-doped InAs/Ga(In)Sb superlattice, or similar n-doped semiconductor material. The n-doped semiconductor layer 120 can be latticed matched to the p-doped semiconductor layer 100. For example, the n-doped semiconductor layer 120 and the p-doped doped semiconductor layer 100 can each include a quaternary alloy such as $Ga_{1-x}In_xAs_ySb_{1-y}$. In another example, the n-doped semiconductor layer 120 includes an InAs/Ga(In)Sb superlattice and the p-doped doped semiconductor layer 100 includes a quaternary alloy such as $Ga_{1-x}In_xAs_ySb_{1-y}$. In some embodiments, the n-doped semiconductor layer 120 is about 75-150 nm or about 100 nm thick and has a dopant concentration of about 1e16-1e19 cm$^{-3}$ or about 1e17-1e18 cm$^{-3}$. The n-type dopant in the n-doped semiconductor layer 120 can be tellurium and/or other similar dopant materials. The n-doped semiconductor layer 120 can be n-GaSb and can function as a passivating layer, for example, by inhibiting minority carriers (i.e., holes) from reaching the air-semiconductor interface (i.e., the exposed surface of contact layer 140) where recombination can occur rapidly.

Semiconductor layers 100 and 120 form a junction 130 (e.g., a n-p junction). In some embodiments, the n-p junction 130 is a homojunction (i.e., the p-doped semiconductor layer 100 and the n-doped semiconductor layer 120 are both the same material, e.g., a quaternary alloy $Ga_{1-x}In_xAs_ySb_{1-y}$). In some embodiments, the n-p junction 130 is a heterojunction (i.e., the p-doped semiconductor layer 100 and the n-doped semiconductor layer 120 are different materials, e.g., the p-doped semiconductor layer 100 is a quaternary alloy $Ga_{1-x}In_xAs_ySb_{1-y}$ and the n-doped semiconductor layer 120 is n-GaSb). In some embodiments, the junction 130 is a p-n junction.

A contact layer 140 is deposited (e.g., epitaxially grown) on top of the n-doped semiconductor layer 120. Contact layer 140 can include n-InAs or a similar n-doped semiconductor material. In some embodiments, the contact layer 140 is about 5-20 nm or about 10 nm thick and has a concentration of at least 1e18 cm$^{-3}$, e.g., between about 1e18-1e19 cm$^{-3}$. The n-type dopant in the contact layer 140 can be tellurium and/or other similar dopant materials.

In some embodiments, an optional cap layer (not shown) can be deposited on the contact layer 140. The cap layer can comprise antimony (e.g., substantially pure antimony, e.g., 99.99% pure antimony or higher, e.g., 99.999% pure or 99.9999% pure) and can be deposited epitaxially (e.g., by molecular beam epitaxy) on the contact layer 140. The cap layer can be about 300 nm+/−200 nm thick (e.g., about 100-200 nm, about 200-300 nm, about 300-400 nm, or about 400-500 nm). Without wishing to be bound by theory, an antimony cap may reduce the loss of antimony from the underlying layers 100, 110, 120, and/or 140. A reduced antimony concentration may reduce the crystalline quality (e.g., by increasing vacancies in the crystal structure) of any antimony-containing III-V semiconductor materials in the underlying layers 100, 110, 120, and/or 140, which can degrade device performance (e.g., by increasing resistance and/or leakage current).

Figure 1B:
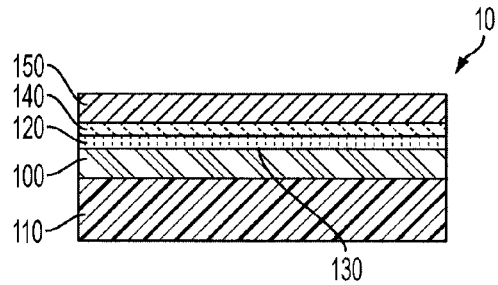

FIG. 1b depicts a second step in the exemplary manufacturing process described above. In this step, an insulator layer (e.g., a dielectric layer) 150 is deposited on top of (e.g., on an exposed surface of) contact layer 140. In some embodiments, the insulator layer 150 is a p-doped dielectric layer. Suitable dielectric layers can comprise silicon dioxide (i.e., SiOx), hafnium silicate, zirconium silicate, hafnium dioxide zirconium dioxide, and/or similar dielectric layers known in the art, or combinations thereof. The p-dopant can be Zn, Be, Cd, Hg, other similar p-dopants, or a combination thereof. In some embodiments, the insulator layer 150 can comprise Zn-doped silicon oxide (i.e., Zn:SiOx). The concentration of p-dopants can depend on the thickness of the insulator layer 150. In some embodiments, the concentration of p-dopants can be about 1e17-1e18 cm$^{-3}$ and the thickness of the insulator layer 150 can be between about 1-10 μm. In some embodiments, the insulator layer 150 is a n-doped insulator layer (e.g., with Te as the dopant).

The insulator (e.g, Zn:SiOx) can be deposited and/or applied by a spin coater (i.e., spun-on) or other techniques known in the art (e.g., chemical vapor deposition, physical vapor deposition, or variations thereof). The spin coater can rotate at about 3,000 rpms or higher, e.g., about 3,000-5,000 rpms or about 4,000 rpms. A higher rotation speed (e.g., at least 3,000 rpms) can minimize the variation in thickness of the insulator layer 150. After deposition (e.g., spin-on deposition), the insulation layer 150 can be cured at an elevated temperature. For example, a Zn:SiOx insulation layer 150 can be cured at about 100° C. for about 10 minutes. In some embodiments, the insulation layer 150 can be cured at about 75-150° C., about 100-125° C., or about 100° C. for about 5-20 minutes, about 10-15 minutes, or about 10 minutes. The cure can occur in an anneal oven, a rapid thermal anneal, or other techniques known in the art. The anneal can occur in atmospheric gas conditions, in a substantially inert gas environment (e.g., argon or other similar inert gases), or in a substantially nitrogen environment, or a combination thereof. In some embodiments, a substantially inert and/or a substantially nitrogen environment can have a concentration of at least 90% inert and/or nitrogen gas.

In some embodiments, the contact layer 140 of the wafer 10 can be cleaned with a solution prior to the deposition of the insulator layer 150. The solution can comprise acetone, isopropanol, ethanol, and/or similar solutions, or combinations thereof. Cleaning can remove particles, dirt, grease, and/or foreign material from an exposed surface of the contact layer 140. The contact layer 140 of the wafer 10 can then be dried to remove the solution. Suitable methods of drying can include air drying, vacuum drying, passing air across the contact layer 140 of the wafer 10, and/or applying heat (e.g., by a heated gas source) to the contact layer 140 of the wafer 10.

Figure 1C:
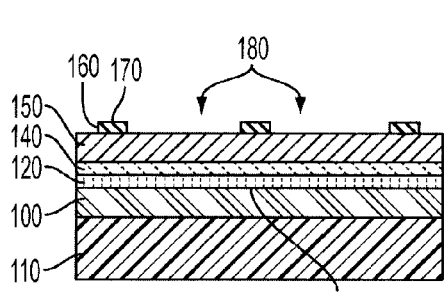

FIG. 1c depicts a third step in the exemplary manufacturing process described above. In this step, a photoresist layer 160 is deposited (e.g., spun-on) and patterned using conventional photolithography techniques to form isolated deposits 170 of photoresist between voids 180. The voids 180 expose portions of the insulator layer 150.

Figure 1D:
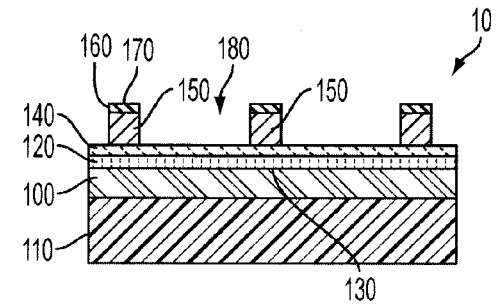

FIG. 1d depicts a fourth step in the exemplary manufacturing process described above. In this step, the p-doped glass layer 150 disposed below voids 180 is removed by, e.g., an etch process. The etch process can be a selective chemical etch, such as with HF, or other technique known in the art.

Figure 1E:
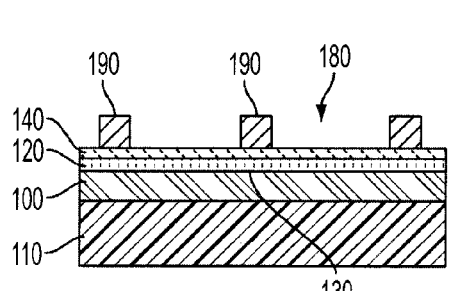
Figure 1F:
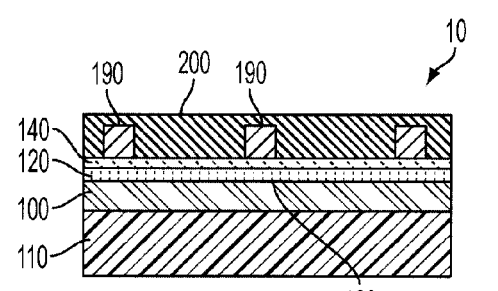

FIG. 1e depicts a fifth step in the exemplary manufacturing process described above. In this step, the isolated deposits 170 of photoresist layer 160 are removed by conventional methods, e.g., with a solvent. Patterned deposits 190 of p-doped glass layer 150 remain after the isolated deposits 170 have been removed FIG. 1f depicts a sixth step in the exemplary manufacturing process described above. A cap layer 200 is deposited on the patterned deposits 190 of the p-doped insulator layer 150. The cap layer 200 can reduce the loss of volatile chemicals from the various materials in wafer 10 during subsequent thermal processing. The cap layer 200 can include a GaSb substrate, pyrolitic boron nitride (PBN), a SiN dielectric layer (e.g., sputtered or chemical vapor deposition SiN), or another similar cap. In some embodiments, the cap layer 200 comprises a SiN dielectric layer and is between about 100 nm to 1 μm thick, between about 250 to 750 nm thick, or about 500 nm thick.

Figure 1G:
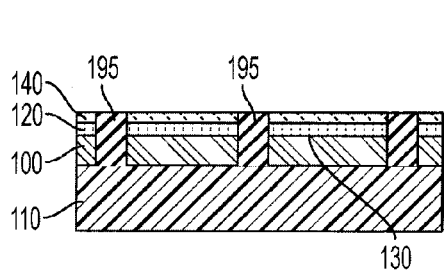

FIG. 1g depicts a seventh step in the exemplary manufacturing process described above. The wafer 10 is annealed for a time long enough for the p-dopant (e.g., Zn) in the patterned deposits 190 to diffuse through the n-p junction 130 (i.e., through the contact layer 140 and n-doped semiconductor layer 120) into at least a portion of the p-doped semiconductor layer 100 to form patterned deposit regions 195. In some embodiments, the patterned deposits regions 195 diffuse through or partially through the p-doped semiconductor layer 100. In some embodiments, the patterned deposit regions 195 diffuse through the n-doped semiconductor layer 120 and not into the p-doped semiconductor layer 100. In some embodiments, the anneal process occurs in a furnace filled with an inert and/or non-reactive gas (e.g., Ar or $N_2$). The inert and/or non-reactive gas atmosphere in the furnace can be substantially high purity (e.g., having a concentration of at least about 95%, about 99.9%, or about 99.99% inert and/or non-reactive gas). In some embodiments, the furnace can be a vacuum furnace (e.g., a medium-vacuum furnace having a pressure of about 1e-5 to 1e-6 torr).

The anneal process can occur at a temperature below the melting point of the materials on the wafer 10. In some embodiments, the anneal temperature is about 450-500° C. The anneal time can depend on the anneal temperature, thickness of the p-doped glass layer 150, dopant concentration of p-doped glass layer 150, and type of p-dopant (e.g., Zn) in patterned deposits 190. For example, an anneal at about 500° C. can take about 1 hour for sufficient diffusion to occur. Diffusion depth in the wafer 10 can be confirmed with secondary ion mass spectrometry (SIMS) or electrochemical CV profiling after breaking the wafer 10. Next, the patterned deposits 190 and cap layer 200 are removed using conventional methods (e.g., etch, chemical mechanical polishing, wet processing, etc.), leaving patterned deposit regions 195, as described above.

The n-side (i.e., n-doped semiconductor layer 120 and contact layer 140) of the n-p junction 130 can be thin (e.g., about 75-150 nm or about 100 nm, in combination) relative to the p-doped semiconductor layer 100. An advantage of a thin n-side of the n-p junction 130 is to minimize the depth necessary for the dopants (e.g., in patterned dopant regions 195) to diffuse during thermal processing. As the diffusion depth increases, the semiconductor device 10 must be heated to higher temperatures and/or for longer times, which can cause damage to the various materials on semiconductor device 10. An advantage of a relatively thick (e.g., between about 3-7 μm or about 5 μm thick) p-doped semiconductor layer 100 is that minority carrier diffusion lengths are longer and so the absorbing region can be thicker and/or detector responsivity can be higher.

The resulting structure is of one or more (e.g., a focal plane array) photodiode elements that can substantially reduce the problems associated with the mesa structures. The method described can eliminate the additional manufacturing steps employed to minimize side current leakage in mesa structures: e.g., chemical cleaning, passivation, and encapsulation. The method can reduce the current leakage at the edges of the photodiode elements, thus improving device performance and accuracy.

Figure 2:
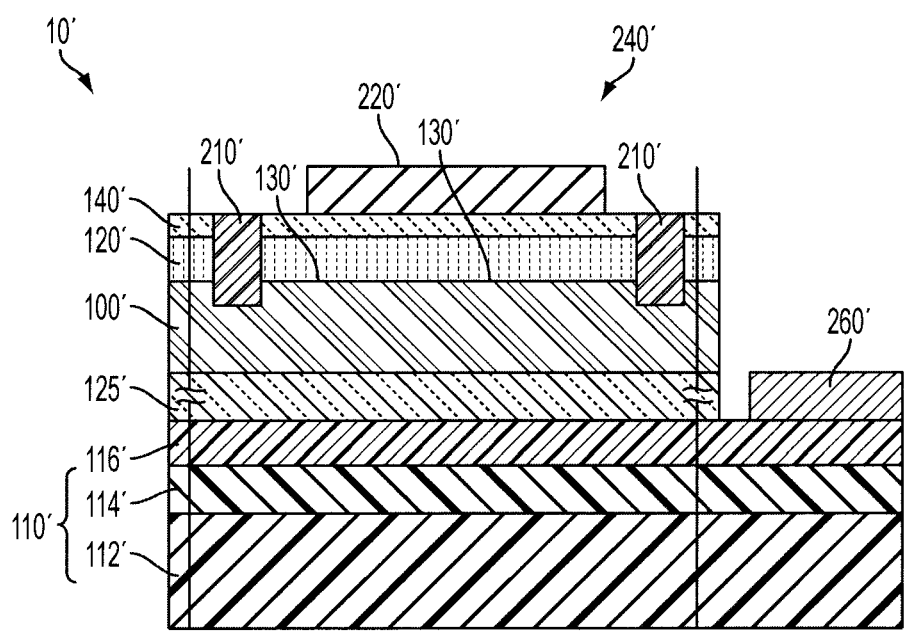
FIG. 2 depicts an exemplary cross-sectional view of a photodiode detector according to an embodiment of the invention.

FIG. 2 depicts an exemplary cross-sectional view of a photodiode detector according to an embodiment of the invention. A semiconductor device 10' includes base layer 110', a p-doped semiconductor layer 100', a n-doped semiconductor layer 120', and a contact layer 140'. The base layer 110' includes a substrate layer 112', a first buffer layer 114', and a second buffer layer 116'. The substrate layer 112' is a n-doped semiconductor material. In some embodiments, the substrate material includes a III-V semiconductor (e.g., GaSb, GaAs, etc.). For example, photodiode detectors can be manufactured on antimony-based III-V semiconductor substrates. Antimony-based III-V semiconductor substrates can have a 6.1 Angstrom lattice constant. In some embodiments, the substrate layer 112' includes n-GaSb. The dopant concentration of the substrate layer 112' can be less than or equal to about 2e17 $cm^{-3}$. The use of n-type GaSb substrates can be useful for back-illuminated detectors because n-type GaSb substrates are transparent to infrared radiation. In contrast, p-type GaSb substrates absorb longer wavelengths due to free-carrier absorption and can be useful for front-illuminated detectors. The n-doped substrate layer 112' is disposed between the first buffer layer 114' and a wafer. The n-doped substrate layer 112' can be between about 300-1,000 about 500-700 or about 600 μm thick. The substrate layer 112' can include Te and/or other similar n-dopant materials as the dopant.

The first buffer layer 114' can include n-GaSb or another similar n-doped semiconductor. The first buffer layer 114' can be about 500-1,000 nm thick and have a dopant concentration of about 1e17-1e19 $cm^{-3}$ or about 1e18-1e19 $cm^{-3}$. In some embodiments, the first buffer layer 114' includes Te and/or other similar dopant materials as the n-dopant. Second buffer layer 116' can include p-GaSb or other similar p-doped III-V semiconductor materials. Second buffer layer 116' can be about 1-3 μm thick or about 2 μm and have a dopant concentration of at least about 1e18 $cm^{-3}$, e.g., between about 1e18-1e19 $cm^{-3}$. In some embodiments, the second buffer layer 116' includes Be, Zn, Hg, Cd, and/or other similar dopant materials as the p-dopant. In some embodiments, a third layer (e.g., about 5-20 nm or about 10 nm in thickness) can be deposited between the first buffer layer 114' and the second buffer layer 116'. The third layer can comprise AlAsSb or other similar materials (e.g., wide bandgap materials). The third layer can prevent electrical leakage between the first buffer layer 114' and the second buffer layer 116'.

Optional thin graded region 125' can be disposed between second buffer layer 116' and p-doped semiconductor layer 100'. The thin graded region 125' can smooth out the band structure to improve the transport of photogenerated holes to metal contact 260'. The thin graded region 125' can be about 5-20 nm or about 10 nm thick. In some embodiments, thin graded region 125' includes a region of graded dopant concentration from a low dopant concentration (e.g., about 1e16 cm$^{-3}$) adjacent the p-doped semiconductor layer 100' to a high dopant concentration (e.g., about 1e18 cm$^{-3}$) adjacent the second buffer layer 116'. In other embodiments, thin graded region 125' includes a region having varied bandgap energies. The bandgap energies of the material in thin graded region 125' can be higher near the second buffer layer 116' and lower near the p-doped semiconductor layer 100'.

The p-doped semiconductor layer 100' can include an antimony-containing III-V semiconductor, including quaternary alloys such as GaInAsSb and/or an InAs/Ga(In)Sb superlattice. By changing the concentration of the constituent elements, the cut-off wavelength of a bulk $Ga_{1-x}In_xAs_ySb_{1-y}$ quaternary alloy (e.g., p-doped semiconductor layer 100') can in principle be tuned from 1.7 μms to 4.9 μms while remaining lattice matched or with intentional small strains to a GaSb substrate (e.g., substrate 112'). If the elements in the layer 100' are kept in the ratio $(GaSb)_{1-z}(InAs_{0.91}Sb_{0.09})_z$, the alloy will remain lattice matched to the GaSb substrate (e.g., substrate 112') as the alloy bandgap varies with composition ration Z (from 0 to 1) as shown in FIG. 3.

Figure 3:
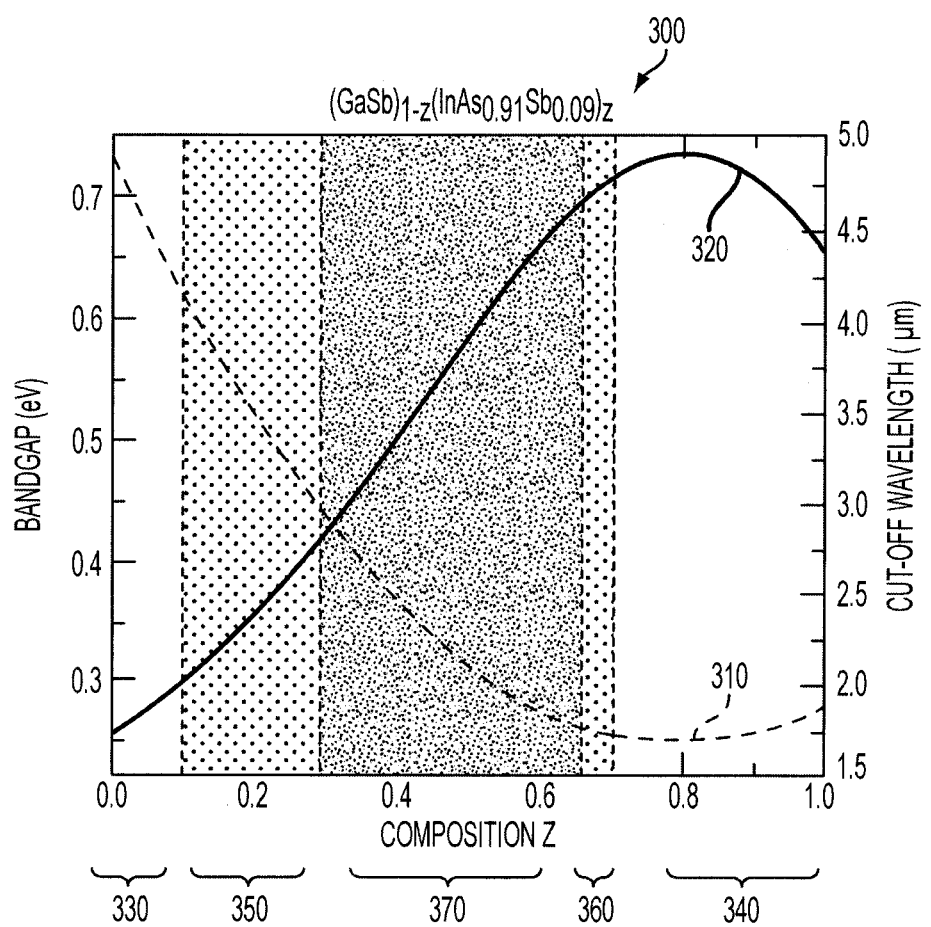
FIG. 3 depicts an exemplary graph in which a composition ratio Z of quaternary alloy $(GaSb)_{1-z}(InAs_{0.91}Sb_{0.09})_z$ is plotted against bandgap energy (eV) and cut-off wavelength (μm) according to an embodiment of the invention.

FIG. 3 depicts an exemplary graph 300 in which a composition ratio Z of quaternary alloy $(GaSb)_{1-z}(InAs_{0.91}Sb_{0.09})_z$ is plotted against bandgap energy (eV) and cut-off wavelength (μm). The dashed plot line 310 corresponds to the bandgap energy and the solid plot line 320 corresponds to the cut-off wavelength. The composition regions with a white background 330 and 340 are thermodynamically stable. The composition regions with a coarsely-dotted background 350 and 360 are thermodynamically metastable. The composition region with a shaded background (i.e., with small dots) 370 is thermodynamically unstable.

Composition regions 330 and 350 are the stable and metastable regions that collectively correspond to a composition range of about 0.0-0.3 and to a cut-off wavelength of about 1.6-2.9 μm, respectively. This cut-off wavelength range has commercial applications for various types of spectroscopic instruments (e.g., glucose detectors), process monitoring, chemical sensing, medical diagnostics, and IR imaging, such as security surveillance and enhanced vision systems (e.g., for automotive head-up displays). Enhanced vision systems can include improved night-vision imaging of warm bodies, such as people or deer crossing roads, or to penetrate fog or dust better than is possible with visible light. Composition ranges 360 and 340 are the stable and metastable regions that collectively correspond to a composition range of about 0.7-1.0 and to a cut-off wavelength of about 4.4-4.9 μm. This cut-off wavelength range has commercial applications for various types of military applications such as detecting enemy fire from a distance, e.g., sensing gun flashes or rocket launches, and night-vision sensors.

Returning to FIG. 2, the n-doped semiconductor layer 120' is disposed above the p-doped semiconductor layer 100' to create a junction 130' (e.g., a n-p junction). In some embodiments, the n-p junction 130' is a homojunction (e.g., the p-doped semiconductor layer 100' and the n-doped semiconductor layer 120' are both the same material, e.g., a quaternary alloy $Ga_{1-x}In_xAs_ySb_{1-y}$). In some embodiments, the n-p junction 130' is a heterojunction (e.g., the p-doped semiconductor layer 100' is a quaternary alloy $Ga_{1-x}In_xAs_ySb_{1-y}$ and the n-doped semiconductor layer 120' is n-GaSb). In some embodiments, the p-doped semiconductor layer 100' and the n-doped semiconductor layer 120' are lattice matched.

The n-doped semiconductor layer 120' can include n-GaSb, a n-doped quaternary alloy such as $Ga_{1-x}In_xAs_ySb_{1-y}$, a n-doped InAs/Ga(In)Sb superlattice, or a similar n-doped semiconductor material. The n-doped semiconductor layer 120' can be lattice matched to the p-doped semiconductor layer 100'. For example, the n-doped semiconductor layer 120' and p-doped semiconductor layer 100' can each include a quaternary alloy such as $Ga_{1-x}In_xAs_ySb_{1-y}$. In another example, the n-doped semiconductor layer 120' and p-doped semiconductor layer 100' can each include an InAs/Ga(In)Sb superlattice. In some embodiments, the n-doped semiconductor layer 120' is 75-150 nm or about 100 nm thick and has a dopant concentration of about 1e16-1e19 cm$^{-3}$. The dopant in the n-doped semiconductor layer 120' can be tellurium and/or other similar n-dopant materials. The n-doped semiconductor layer 120' can be n-GaSb and can function as a passivating layer, for example, by inhibiting minority carriers (i.e., holes) from reaching the air-semiconductor interface (i.e., the exposed surface of contact layer 140') where recombination can occur rapidly.

The n-side (i.e., n-doped semiconductor layer 120' and contact layer 140') of the n-p junction 130' can be thin (e.g., about 75-150 nm or about 100 nm, in combination) relative to the p-doped semiconductor layer 100'. An advantage of a thin n-side of the n-p junction 130' is to minimize the depth necessary for the dopants to diffuse during thermal processing. As the diffusion depth increases, the semiconductor device 10' must be heated to higher temperatures and/or for longer times, which can cause damage to the various materials in semiconductor device 10'. An advantage of a relatively thick (e.g., about 3-7 μm or about 5 μm thick) p-doped semiconductor layer 100' is that minority carrier diffusion lengths are longer and so the absorbing region can be thicker and detector responsivity can be higher.

The contact layer 140' can include n-InAs or other similar n-doped semiconductor material. In some embodiments, the contact layer 140' is 10 nm thick and has a concentration of at least 1e18 cm$^{-3}$, e.g., between 1e18-1e19 cm$^{-3}$. The dopant in the n-doped contact layer 140' can include tellurium and/or other similar n-dopant materials. In some embodiments, a cap layer (not shown) can be disposed on the contact layer 140'. The cap layer can comprise antimony (e.g., substantially pure antimony, e.g., 99.99% pure antimony or higher, e.g., 99.999% pure or 99.9999% pure) and can be deposited epitaxially (e.g., by molecular beam epitaxy) on the contact layer 140'. The cap layer can be about 300 nm+/−200 nm thick. Without wishing to be bound by theory, an antimony cap may reduce the loss of antimony from the underlying layers 100', 110', 120', and/or 140'. A reduced antimony concentration may reduce the crystalline quality (e.g., by increasing vacancies in the crystal structure) of any antimony-containing III-V semiconductor materials in the underlying layers 100', 110', 120', and/or 140', which can degrade device performance (e.g., by increasing resistance and/or leakage current).

Patterned dopant regions 210' (e.g., diffused according to the processes described with respect to FIGS. 1f and 1g above) are disposed within contact layer 140', n-doped semiconductor layer 120', and p-doped semiconductor layer 100'. Patterned dopant regions 210' can comprise Zn, Be, Hg, Cd, and/or other similar p-dopants, or a combination thereof. In some embodiments, the diffused dopant regions 210' include n-dopants. In some embodiments, the patterned deposit regions 210' are disposed within contact layer 140', n-doped semiconductor layer 120', but are not disposed in p-doped semiconductor layer 100'.

A contact 220' is disposed above contact layer 140' and between patterned dopant regions 210'. In some embodiments, contact 220' has a Pd/Ge/Au/Pt/Au structure.

Detector elements 240', e.g., in a focal plane array, are defined by disposing patterned dopant regions 210' (e.g., p-dopants) across the barrier regions (e.g., an n-p junction) between the n-doped semiconductor region 120' and p-doped semiconductor region 100'. In some embodiments, the patterned deposit regions 210' are disposed within contact layer 140', n-doped semiconductor layer 120', but are not disposed in p-doped semiconductor layer 100'. The diffused dopant regions 210' create a reverse p-n junction that can prevent majority carriers (i.e., electrons) in the n-doped semiconductor region 120' from diffusing laterally to an adjacent detector element. The reverse p-n junction can ensure that the majority carriers (i.e., electrons) are collected at the contact 220' on top of the detector elements 240'. Hole carriers are collected at a common contact 260' connected to the bottom side of the detector elements 240'. The common contact 260' can have a Ti/Pt/Au structure.

The article of manufacture described above is a series (e.g., a focal plane array) of photodiode elements that can substantially reduce the problems associated with the mesa structures. The article of manufacture described above can eliminate the additional manufacturing steps employed to minimize side current leakage in mesa structures: chemical cleaning, passivation, and encapsulation. In addition, the article of manufacture can reduce the current leakage at the edges of the photodiode elements, thus improving device performance and accuracy.

Although the invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims cover be construed to all such equivalent variations as fall within the true spirit and scope of the invention.

What is claimed is:

1. An article of manufacture comprising:
a photodetector element comprising:
a base layer comprising a substrate layer and a plurality of buffer layers;
a junction formed by:
a first III-V semiconductor layer comprising a first dopant having a first charge type; and
a second III-V semiconductor layer comprising a second dopant having a second charge type, the second III-V semiconductor layer disposed between the first III-V semiconductor layer and the base layer; and
one or more patterned dopant regions having a third charge type, the third charge type being the same as the first charge type, the one or more patterned dopant regions disposed in the first III-V semiconductor layer.

2. The article of manufacture of claim 1, wherein the first III-V semiconductor layer further comprises a first III-V quaternary material and the second III-V semiconductor layer further comprises a second III-V quaternary material.

3. The article of manufacture of claim 1, wherein the one or more patterned dopant regions form a reverse junction with the first III-V semiconductor layer.

4. The article of manufacture of claim 1, wherein the one or more patterned dopant regions are further disposed in the second III-V semiconductor layer.

5. The article of manufacture of claim 1, wherein the junction is a n-p junction.

6. The article of manufacture of claim 1, wherein the one or more patterned dopant regions define an array of photodetector elements.

7. The article of manufacture of claim 1, wherein the first III-V semiconductor layer and the second III-V semiconductor layer each further comprise a GaInAsSb quaternary material.

8. The article of manufacture of claim 1, wherein the first III-V semiconductor layer is lattice matched to the second III-V semiconductor layer.

9. The article of manufacture of claim 1, wherein the base layer comprises a third III-V semiconductor material comprising a fourth dopant having a fourth charge type,
wherein the photodetector element further comprises:
a contact layer comprising a fourth III-V semiconductor material, the fourth III-V semiconductor material comprising a fifth dopant having a fifth charge type, and
wherein the second III-V semiconductor layer is disposed between the base layer and the contact layer.

10. The article of manufacture of claim 1, wherein the plurality of buffer layers comprises a first buffer layer and a second buffer layer.

11. The article of manufacture of claim 10, wherein the first buffer layer comprises an n-doped semiconductor.

12. The article of manufacture of claim 10, wherein the second buffer layer comprises a p-doped semiconductor.

* * * * *